(12) United States Patent
Ajiki

(10) Patent No.: US 7,723,804 B2
(45) Date of Patent: May 25, 2010

(54) SEMICONDUCTOR DEVICE, ELECTRO-OPTIC DEVICE, AND ELECTRIC DEVICE

(75) Inventor: Yoshiharu Ajiki, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 697 days.

(21) Appl. No.: 11/465,307

(22) Filed: Aug. 17, 2006

(65) Prior Publication Data

US 2007/0040193 A1    Feb. 22, 2007

(30) Foreign Application Priority Data

Aug. 18, 2005  (JP) .............................. 2005-237909

(51) Int. Cl.
*H01L 27/088* (2006.01)
(52) U.S. Cl. .................. 257/393; 257/206; 257/390; 257/205; 257/401
(58) Field of Classification Search ................. 257/205, 257/206, 390, 393, 401
See application file for complete search history.

(56) References Cited

U.S. PATENT DOCUMENTS

| | | | |
|---|---|---|---|
| 2005/0162579 A1* | 7/2005 | Jeong et al. | 349/43 |
| 2005/0181587 A1* | 8/2005 | Duan et al. | 438/551 |
| 2005/0189595 A1* | 9/2005 | Okamoto et al. | 257/368 |
| 2005/0258420 A1* | 11/2005 | Kido | 257/48 |

FOREIGN PATENT DOCUMENTS

| | | |
|---|---|---|
| JP | A 9-312349 | 12/1997 |
| JP | 2003-197915 | 7/2003 |
| JP | A-2004-328002 | 11/2004 |
| JP | 2005-039171 | 2/2005 |
| JP | 2008-505352 | 2/2008 |
| WO | WO 2006/003622 A1 | 1/2006 |

* cited by examiner

*Primary Examiner*—Zandra Smith
*Assistant Examiner*—Telly D Green
(74) *Attorney, Agent, or Firm*—Oliff & Berridge, PLC

(57) ABSTRACT

A semiconductor device includes a semiconductor layer, and a first transistor and a second transistor that are formed using the semiconductor layer, wherein each conductance of the first and second transistors changes complementarily to each other according to a curvature of the semiconductor layer.

12 Claims, 16 Drawing Sheets

SEMICONDUCTOR DEVICE, ELECTRO-OPTIC DEVICE, AND ELECTRIC DEVICE

BACKGROUND

1. Technical Field

The present invention relates to a semiconductor device wherein semiconductor elements such as transistors etc. are used on a bendable substrate.

2. Related Art

In recent years, the experimental production of bendable display devices, e.g. sheet-type display devices having flexibility such as electronic papers, organic EL displays etc., has been in progress. In such display devices, electric circuits configured of pixels and transistors are formed on a flexible substrate, for example. Transistors are made of semiconductors such as amorphous silicon film, polycrystalline silicon film, monocrystalline silicon film etc., which can be referred to in an example of related art JP-A-9-312349.

When a sheet-type display device is bent for use, however, transistors that have been formed on a flexible substrate in a flat state are slightly deformed with the curvature of the substrate. The deformation has been found to change the characteristics of transistors. The change of transistor characteristics could cause the malfunction of electric circuits formed on a substrate.

SUMMARY

An advantage of the invention is to provide a semiconductor device, an electro-optic device, and an electric device that show less change of transistor characteristics even when a substrate is bent (deformed).

According to a first aspect of the invention, a semiconductor device includes a semiconductor layer, and a first transistor and a second transistor that are formed using the semiconductor layer. In the same semiconductor device, each conductance of the first and second transistors changes complementarily to each other according to the curvature of the semiconductor layer.

With the above configuration, even when a substrate having a semiconductor device is bent, the change of characteristics of the semiconductor device caused by curvature, e.g. the relation of drain current Id running between a source and a drain versus applied voltage Vds running between the source and the drain (Id-Vds characteristics), can be controlled. Therefore, the placement of electric circuits becomes possible on, for example, the curving part of a substrate that electrically couples two units together, a curved display etc., which makes it easier to configure much smaller devices. Here, a conductance (conductance coefficient) g is expressed as: $g=\Delta Id/\Delta Vds$.

In the above semiconductor device, it is preferable that a channel region of the first transistor be tensed or compressed in the lengthwise direction of the channel region while a channel region of the second transistor be tensed or compressed in the widthwise direction of the channel region when the semiconductor layer is bent.

Therefore, the increase/decrease in the drain current of the first transistor due to the curvature of the semiconductor layer is balanced out by the decrease/increase in the drain current of the second transistor due to the curvature of the semiconductor layer. In the above case, the curvature of the semiconductor layer includes not only the curvature of a semiconductor layer itself (e.g. a silicon substrate that is made thinner by polishing etc.) but also the curvature of a semiconductor layer deposited on a substrate (e.g. a silicon layer formed by means of CVD, a silicon layer formed by applying and drying liquid silicon etc.) that is caused by the curvature of the substrate. Examples of the substrate are not limited to so-called flexible substrates that are made of resin etc. but include substrates that are polished into thin substrates and large substrates that are bendable by their own weight, only if bendable.

Drain current (absolute value of drain current) has been found to decrease when the channel region of a transistor is tensed in the direction of its length L (direction of current flow/source-drain direction) due to the curvature of a substrate and increase when the same region is compressed. Further, drain current has also been found to decrease when the channel region of a transistor is tensed in the direction of its width W (widthwise direction of a current path) due to the curvature of a substrate and increase when the same region is compressed.

One of the reasons for such phenomena is considered to be the deformation of the channel region of a transistor. The drain current Id of a transistor is proportional to the width W of the (effective) channel region of the transistor and inversely proportional to the length L of the (effective) channel region of the transistor. That is, the drain current Id is expressed as: $Id=g\cdot VD=(W/L)\cdot f(VD, VG)$. Here, regarding the channel (transistor), g represents conductance, VD represents drain voltage, VG represents gate voltage, and f represents a function.

In the above semiconductor device, it is preferable that the first and second transistors be oriented crossing each other in terms of the lengthwise direction of each gate. Therefore, the channel widthwise direction of the second transistor can be set to coincide with the channel lengthwise direction of the first transistor. By increasing/decreasing the channel region of the second transistor in terms of its channel widthwise direction according to the increase/decrease in the channel region of the first transistor in terms of its channel lengthwise direction, the change of conductance can be controlled.

In the above semiconductor device, it is preferable that the first and second transistors be coupled in parallel to each other at the gates. Therefore, the outputs from the first and second transistors are combined to balance out the fluctuation of each output level due to curvature.

In the above semiconductor device, it is preferable that each of the first and second transistors include a plurality of transistors. Therefore, a transistor having much larger output current, with the influence of curvature compensated, can be obtained.

It is preferable that the number of transistors or the shape and size of the channel region included in each of the first and second transistors be varied so as to make it possible to adjust the difference between the degree of the influence brought by a tension/compression in the channel lengthwise direction and the degree of the influence brought by a tension/compression in the channel width wise direction. Therefore, the influence of curvature can be balanced out more precisely using the two groups of transistors.

In the above semiconductor device, it is preferable that the semiconductor layer be a semiconductor layer that is made thinner by polishing a semiconductor layer or a semiconductor substrate that is deposited on a flexible substrate. Such a semiconductor layer can be formed by, for example, performing polishing or etching from the back surface of a silicon substrate (wafer), on which a transistor is to be formed, to make the substrate thinner. Even a silicon substrate becomes bendable when it is made thinner.

Further, according to a second aspect of the invention, another semiconductor device include a semiconductor layer that is formed on a substrate, a gate electrode that is formed in a circular shape on the semiconductor layer through a gate insulation film, a channel region that is formed in a circular shape on the semiconductor layer overlapping with the gate electrode, a source/drain region surrounding the channel region, and another source/drain region surrounded by the channel region. In the above configuration, examples of the semiconductor layer formed on the substrate include such as a semiconductor substrate (e.g. silicon substrate) that is made thinner by, for example, polishing to give flexibility, a substrate that is formed by depositing a semiconductor layer on a flexible and insulative resin substrate by means of CVD, coating, evaporation etc., and a substrate that is formed by bonding a thin semiconductor layer to a flexible and insulative substrate. A substrate made of organic semiconductor materials to be described later is also allowable.

The circular gate electrode can be shaped in a rectangle, a circle etc. When the gate electrode is shaped in a rectangle, the difference in the influence of curvature between the lengthwise direction and the widthwise direction of the channel can be adjusted by setting different lengths between the vertical sides and the horizontal sides of the rectangle.

With the above configuration, a gate electrode can be shared among a plurality of transistors.

In addition, the source/drain region is a region for injecting charge into the channel region and usually divided into a source region and a drain region with the channel region in between. Current runs from the source region, via the channel region, down to the drain region. In pixel transistors of liquid crystal devices or the like, however, the flow of current running through the channel region is occasionally reversed. When the current flow is reversed, the region that used to be a drain region serves as a source region and the region that used to be a source region serves as a drain region. Therefore, the set of two regions provided herein sandwiching the channel region is called a source/drain region. When one of the two regions serves as a source region, the other serves as a drain region. There are no cases where both regions simultaneously serve as, for example, a source region.

Further, according to a third aspect of the invention, yet another semiconductor device includes a semiconductor layer that is formed on a substrate, a first gate electrode that is formed on the semiconductor layer through a first gate insulation film, a first channel region that is formed on the semiconductor layer below the first gate electrode, a first source/drain region and a second source/drain region that are formed with the first channel region in between, a second gate electrode that is formed on the semiconductor layer through a second gate insulation film, a second channel region that is formed on the semiconductor layer below the second gate electrode, and a third source/drain region and a fourth source/drain region that are formed with the second channel region in between. In the same semiconductor device, the first and second channel regions are oriented crossing each other in terms of the lengthwise direction, the first and third source/drain regions are coupled to each other, and the second and fourth source/drain regions are coupled to each other.

With the above configuration wherein the first and second transistors formed on a flexible substrate, the lengthwise direction of the first-transistor channel region and the widthwise direction of the second-transistor channel region can be oriented in the same direction. Therefore, the change of characteristics of a semiconductor device caused by the flexure or curvature of a substrate becomes controllable.

It is preferable that the above semiconductor device further include a third gate electrode that is formed on the semiconductor layer through a third gate insulation film, a third channel region that is formed on the semiconductor layer overlapping with the third gate electrode, and a fifth source/drain region and a sixth source/drain region that are formed with the third channel region in between. In the same semiconductor device, the third channel region and the first or second channel region are oriented crossing each other in terms of the lengthwise direction, the fifth source/drain region is coupled to the first and third source/drain regions, and the sixth source/drain region is coupled to the second and fourth source/drain regions. Therefore, even if the change of transistor characteristics due to curvature differs significantly between the first and second transistors, the difference can be compensated for with the help of the third transistor.

According to a fourth aspect of the invention, an electro-optic device includes the above-described semiconductor device. Therefore, electric circuits (semiconductor devices) become placeable on the curved surface of a flexible substrate for electric coupling of the wiring provided on the edge of, for example, an image display panel. Hence, image display devices (liquid crystal display panels, organic EL panels etc.) having narrower peripheral regions, for example, can be obtained.

According to a fifth aspect of the invention, an electric device includes the above-described semiconductor device. Therefore, personal computers, video cameras, personal digital assistants etc. having smaller or narrower-periphery displays can be obtained.

In the above semiconductor device, it is preferable that the pair of transistors for controlling the change of characteristics due to curvature and the electric circuits having the pair of transistors be patterned symmetrically on the substrate. Therefore, the degree of substrate curvature or flexure can be made uniform.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described with reference to the accompanying drawings.

First, what has triggered the invention will be described. The inventor of the invention has attempted an observation of how transistor characteristics would change using a substrate having a transistor thereon by bending the transistor after giving flexibility to the substrate by making the substrate thinner. The results of the observation are shown in FIGS. 4 and 5.

Figure 4:
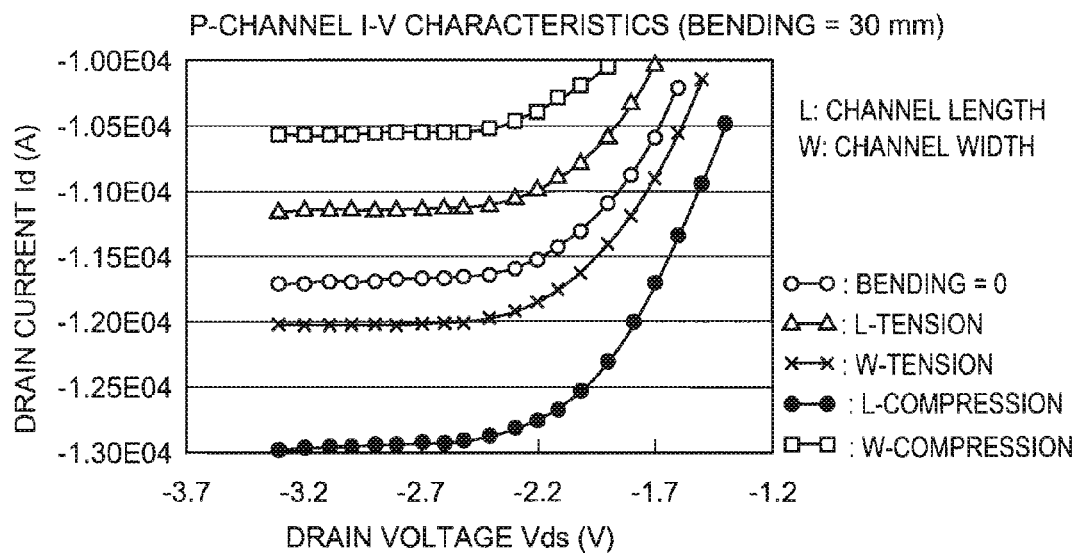
FIG. 4 is a graph showing the change of characteristics of a P-type transistor due to substrate curvature (flexure).
Figure 5:
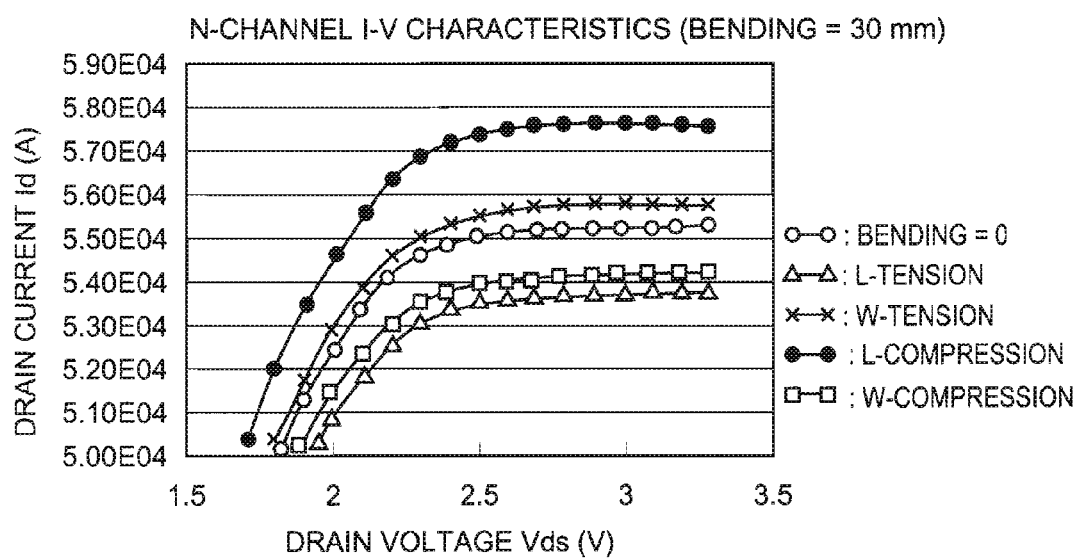
FIG. 5 is a graph showing the change of characteristics of an N-type transistor due to substrate curvature (flexure).

FIG. 4 shows an example of the characteristics of drain current Id versus drain voltage Vd (I-V characteristics) in the case where a P-channel MOS transistor is bent at a bending radius (R) of 30 mm. In FIG. 4, the plot indicated by white squares shows the I-V characteristics in the case where the channel region of the MOS transistor is compressed in the direction of its channel width W due to substrate curvature. The plot indicated by white triangles shows the I-V characteristics in the case where the channel region is tensed in the direction of its channel length L due to substrate curvature. The plot indicated by white dots shows the I-V characteristics in the case where the MOS transistor has no curvature. The plot indicated by crosses shows the I-V characteristics in the case where the channel region of the MOS transistor is tensed in the direction of its channel width W due to substrate curvature. The plot indicated by black dots shows the I-V characteristics in the case where the channel region of the MOS transistor is compressed in the direction of its channel length L due to substrate curvature. In addition, a constant gate voltage Vgs=−3.3 [V] has been applied to the gate of the MOS transistor.

The graph in FIG. 4 shows that drain current (absolute value) increases, compared to the case of no curvature, when a tension due to substrate curvature is applied to the MOS transistor in the direction of channel-region width W. Drain current also increases when a compression due to substrate curvature is applied in the direction of channel-region length L.

Further, drain current (absolute value) decreases when a compression due to substrate curvature is applied to the MOS transistor in the direction of channel-region width W. Drain current also decreases when a tension due to substrate curvature is applied to the MOS transistor in the direction of channel-region length L.

FIG. 5 shows an example of the characteristics of drain current Id versus drain voltage Vd (I-V characteristics) in the case where an N-channel MOS transistor is bent at a bending radius (R) of 30 mm. As in the case of FIG. 4, the plot indicated by white squares in FIG. 5 also shows the I-V characteristics in the case where the channel region of the MOS transistor is compressed in the direction of its channel width W due to substrate curvature. The plot indicated by white triangles shows the I-V characteristics in the case where the channel region is tensed in the direction of its channel length L due to substrate curvature. The plot indicated by white dots shows the I-V characteristics in the case where the MOS transistor has no curvature. The plot indicated by crosses shows the I-V characteristics in the case where the channel region of the MOS transistor is tensed in the direction of its channel width W due to substrate curvature. The plot indicated by black dots shows the I-V characteristics in the case where the channel region of the MOS transistor is compressed in the direction of its channel length L due to substrate curvature. In addition, a constant gate voltage Vgs=3.3 [V] has been applied to the gate of the NMOS transistor.

The graph in FIG. 5 shows that drain current increases, compared to the case of no curvature, when a tension due to substrate curvature is applied to the NMOS transistor in the direction of channel-region width W. Drain current also increases when a compression due to substrate curvature is applied in the direction of channel-region length L.

Further, drain current decreases when a compression due to substrate curvature is applied to the NMOS transistor in the direction of channel-region width W. Drain current also decreases when a tension due to substrate curvature is applied to the NMOS transistor in the direction of channel-region length L.

As described above, bending an MOS transistor has been found to cause a level shift in the I-V characteristics. Due to the level shift, the difference in driving current (Id) may reach approximately 20% at the maximum.

Such a level shift caused by bending the substrate of an MOS transistor changes the operating point of a transistor circuit as to be described below.

Figure 6:
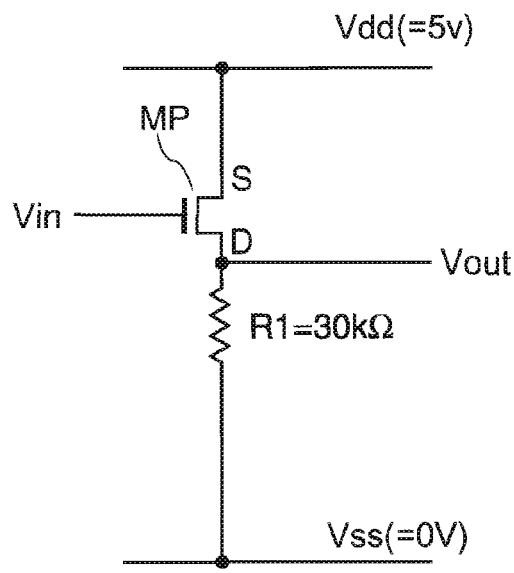
FIG. 6 is a circuit diagram showing the configuration of a transistor amplifier circuit.

FIG. 6 shows an example of a source-grounded amplifier circuit of an MOS transistor. Regarding a PMOS transistor MP, an input voltage Vin is applied to a gate G, a circuit power supply Vdd (=5 V) is coupled to a source S, and a circuit voltage Vss (=0 V) is coupled to a drain D via a resistor R1 of 30 [kΩ] (=30 kΩ). The output of the drain is defined as circuit output.

Figure 7:
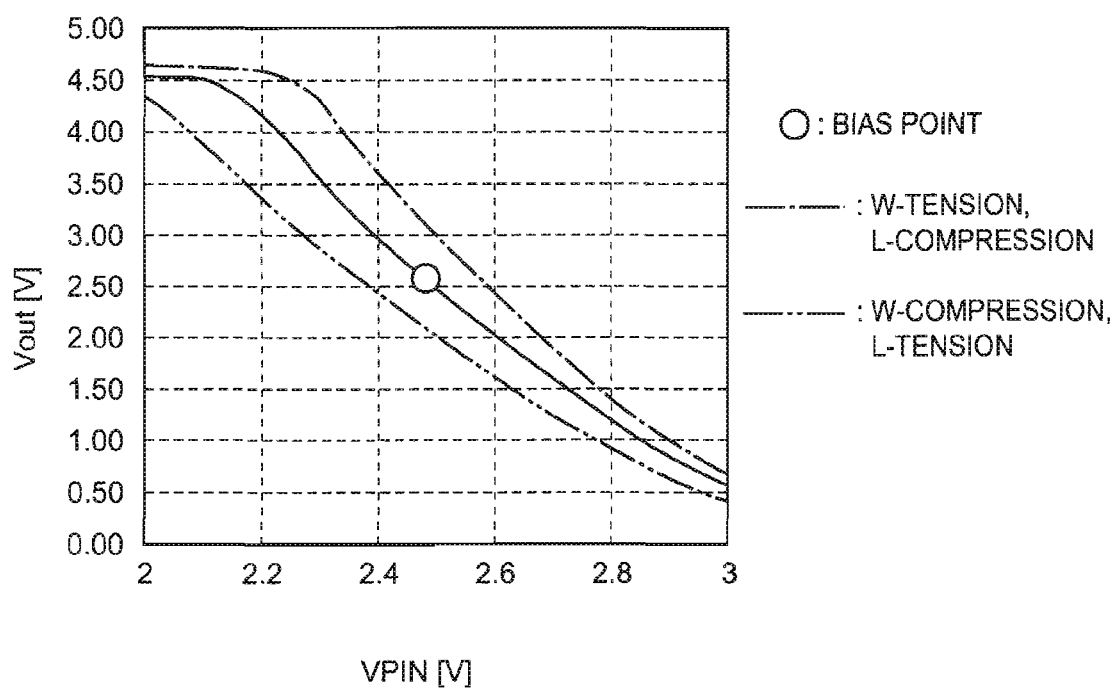
FIG. 7 is a graph showing example operating characteristics of the transistor amplifier circuit.

FIG. 7 shows the result of a circuit simulation regarding the characteristics of input voltage Vin versus output voltage Vout in the above circuit, using a circuit simulator HSPICE (trademark). The solid line in FIG. 7 shows the reference characteristics with no substrate curvature, where an output voltage Vout of 2.5 [V] can be obtained at a gate bias voltage Vbp of 2.5 [V].

Next, when a PMOS transistor is tensed in the direction of its channel width W or compressed in the direction of its channel length L by bending the substrate, the output level increases and makes a shift (the characteristics curve shifts to the right) to move the operating point (bias point), as indicated by the one-dot dashed line in FIG. 7. Further, when a PMOS transistor is compressed in the direction of its channel width W or tensed in the direction of its channel length L by bending the substrate, the output level decreases and makes a shift (the characteristics curve shifts to the left) to move the operating point, as indicated by the two-dot dashed line in FIG. 7.

Therefore, when a substrate etc, having a transistor thereon is bendable, the change of transistor characteristics needs to be considered. This is especially true when a transistor is placed on a flexible printed circuit (FPC) board and an IC card because the circuit board etc. are bendable.

Embodiment 1

Figure 1:
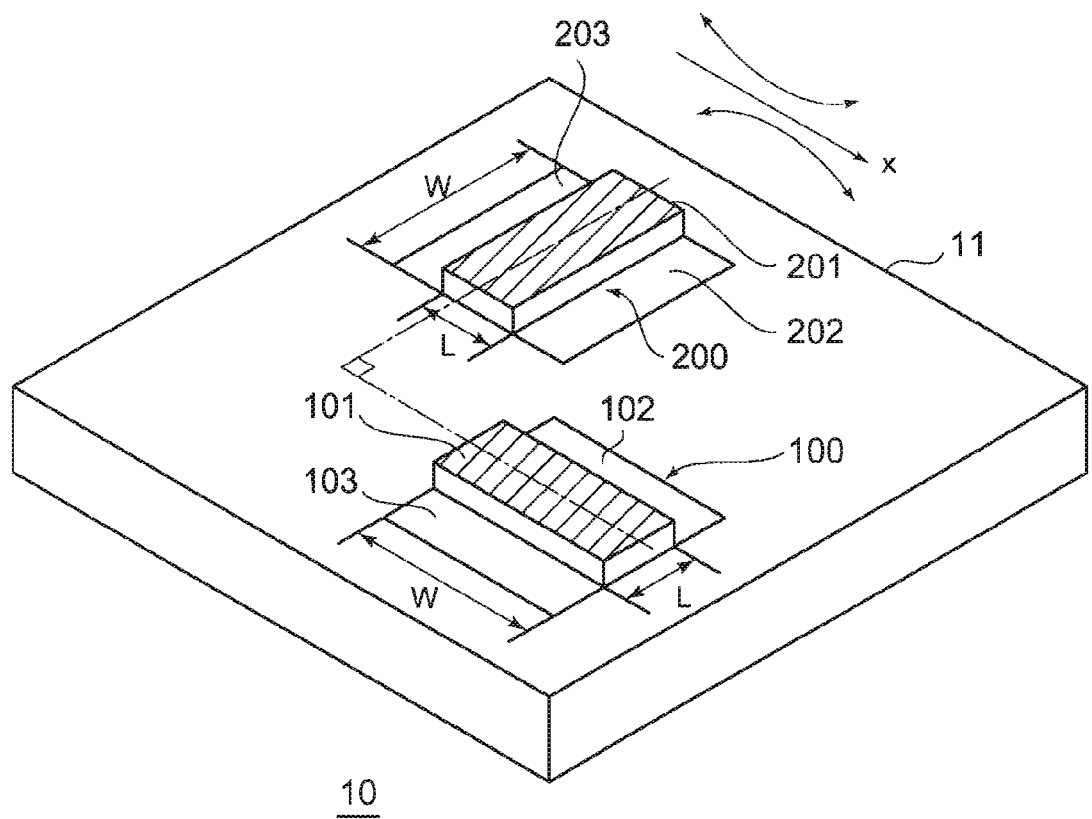
FIG. 1 is a perspective view showing a first embodiment.
Figure 2:
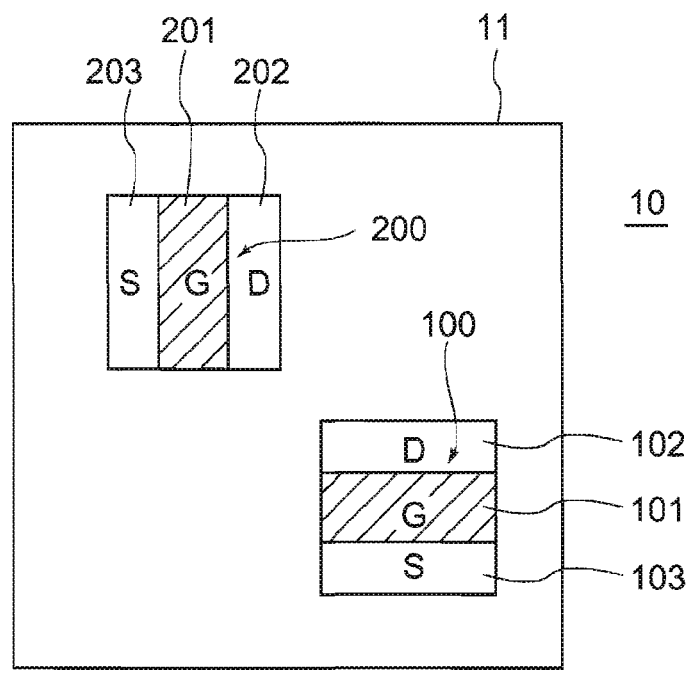
FIG. 2 is a plan view showing the first embodiment.
Figure 3:
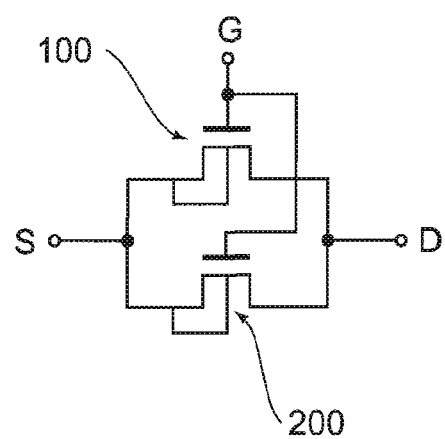
FIG. 3 is a circuit diagram showing an equivalent circuit of the first embodiment.

FIGS. 1 to 3 show a first embodiment of a semiconductor device according to the invention. FIG. 1 is a perspective view, FIG. 2 is a plan view, and FIG. 3 is an equivalent circuit diagram, all of which schematically show the semiconductor device.

As shown in each figure, a semiconductor device 10 has two transistors 100 and 200 as a first transistor and a second transistor on a single substrate 11. Examples of the substrate 11 include, as to be described later, a substrate that is formed by depositing a semiconductor layer, as a transistor, on a flexible insulative substrate such as plastic; or a substrate that is made thinner by polishing the back surface of a silicon substrate having a transistor thereon by means of chemical mechanical polishing (CMP) etc. so as to obtain a thickness of, for example, approximately 10 μm which is thin enough to have flexibility. The transistor 100 is configured of a gate 101, a drain 102, and a source 103, with a channel region below an electrode of the gate 101. The transistor 200 is configured of a gate 201, a drain 202, and a source 203, with a channel region below an electrode of the gate 201.

The transistors 100 and 200 are oriented so that the lengthwise directions of the gates 101 and 201 cross each other at an approximate perpendicular angle. Therefore, the two transistors are oriented with their centerlines (not illustrated) crossing each other in terms of their channel-region widths W or lengths L. Hence, the direction of the channel width W of the transistor 100 coincides with the direction of the channel length L of the transistor 200, and the direction of the channel length L of the transistor 100 coincides with the direction of the channel width W of the transistor 200.

In addition, as shown in FIG. 3, the drains 102 and 202 of the two transistors are electrically coupled to each other on the substrate 11 or via a piece of wiring that is not illustrated. Likewise, the sources 103 and 203 of the two transistors are also electrically coupled to each other.

When the semiconductor device 10 configured as above is bent in the x direction of the substrate 11 (horizontal direction in FIG. 1) so as to be pushed upward in the z direction, the channel region of the transistor 100 is tensed in the direction of its width W, while the channel region of the MOS transistor 200 is tensed in the direction of its length L.

Therefore, the conductance g of the transistor 100 equivalently increases from W/L to (W+ΔW)/L, causing an increase of drain current Id. Here, ΔW is the influence on the channel width brought by curvature. On the other hand, the conductance g of the transistor 200 equivalently decreases from W/L to W/(L+ΔL), causing a decrease of drain current Id. Here, ΔL is the influence on the channel length brought by curvature.

As described above, the transistors 100 and 200 complementarily change each conductance g according to the convex curvature of the substrate 11. The MOS transistors 100 and 200 can serve as a single transistor that is less susceptible to the change due to substrate curvature when used as a paired transistor wherein the outputs of the two transistors 100 and 200 are combined.

Further, when the semiconductor device 10 is bent in the x direction of the substrate 11 so as to be pushed downward in the z direction, the channel region of the MOS transistor 100 is compressed in the direction of its width W, while the channel region of the MOS transistor 200 is compressed in the direction of its length L.

Therefore, the conductance g of the MOS transistor 100 equivalently decreases from W/L to (W−ΔW)/L, causing a decrease of drain current Id. On the other hand, the conductance g of the MOS transistor 200 equivalently increases from W/L to W/(L−ΔL), causing an increase of drain current Id.

As described above, the transistors 100 and 200 also complementarily change each conductance g according to the concave curvature of the substrate 11. The transistors 100 and 200 can serve as a single transistor that is less susceptible to the change due to substrate curvature when used as a paired transistor wherein the outputs of the two transistors 100 and 200 are combined.

In addition, the transistors 100 and 200, which are placed in an approximate L shape in the first embodiment, can be placed in a T shape so as to give the same curvature (curvature factor) to both transistors.

As described above, with the semiconductor device according to the first embodiment of the invention, a semiconductor device that is less susceptible to the influence of substrate curvature can be obtained because the change of transistor characteristics due to substrate curvature can be balanced out by configuring the first and second transistors as a single transistor, wherein the channel width of the first transistor lies in one curving direction of the substrate and the channel length of the second transistor lies in the same curving direction, so that the outputs of the two transistors are combined.

Embodiment 2

Figure 8:
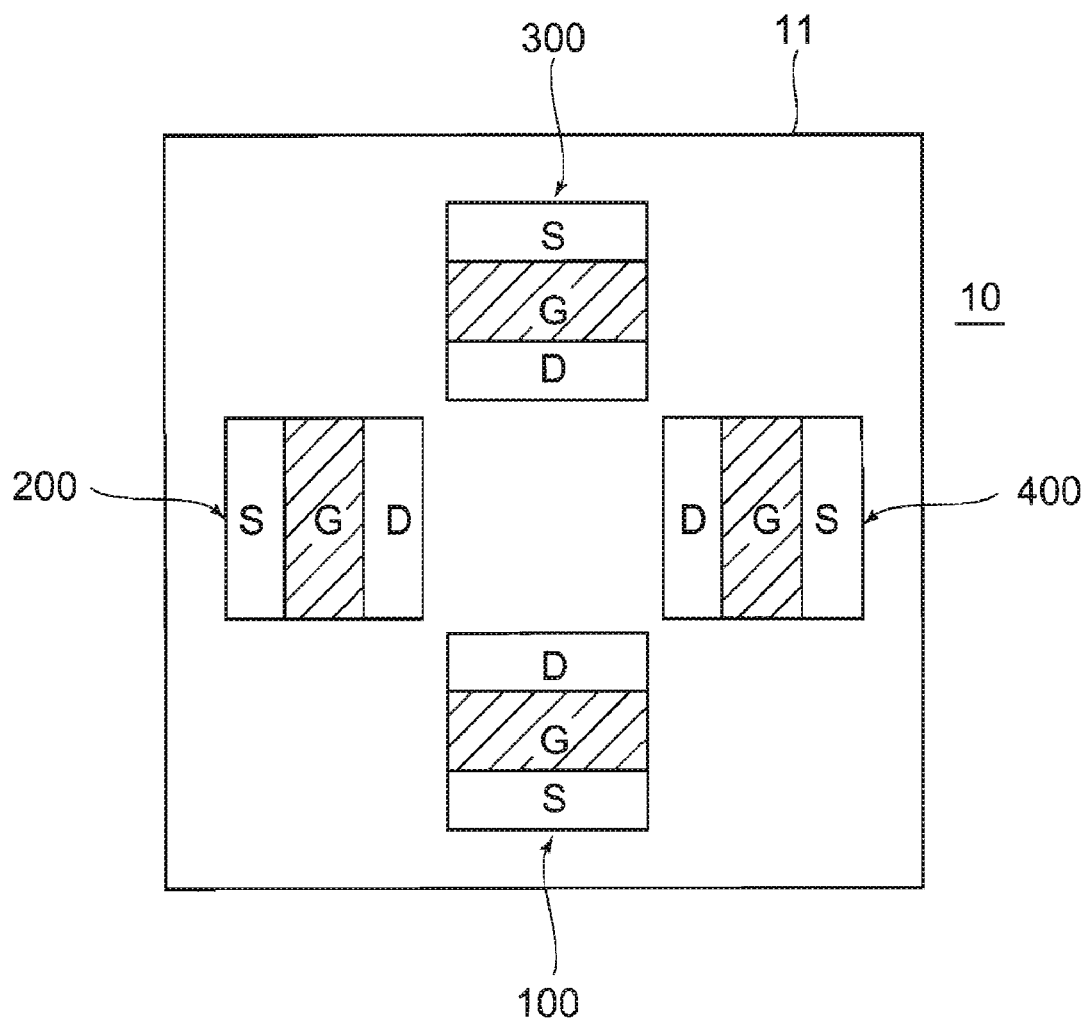
FIG. 8 is an explanatory diagram showing an example configuration of a semiconductor device using four transistors.

FIG. 8 shows a second embodiment of the invention. In FIG. 8, the elements corresponding to those in FIG. 2 are indicated by the same reference numerals and not to be explained here.

In the second embodiment, four transistors are formed on the substrate 11. That is, transistors 300 and 400 are provided in addition to the above-described transistors 100 and 200. The four transistors are placed to form a cross on the substrate 11.

By coupling the four transistors in parallel, a semiconductor device that is less susceptible to the influence of substrate curvature and has larger output can be obtained.

Embodiment 3

Figure 9:
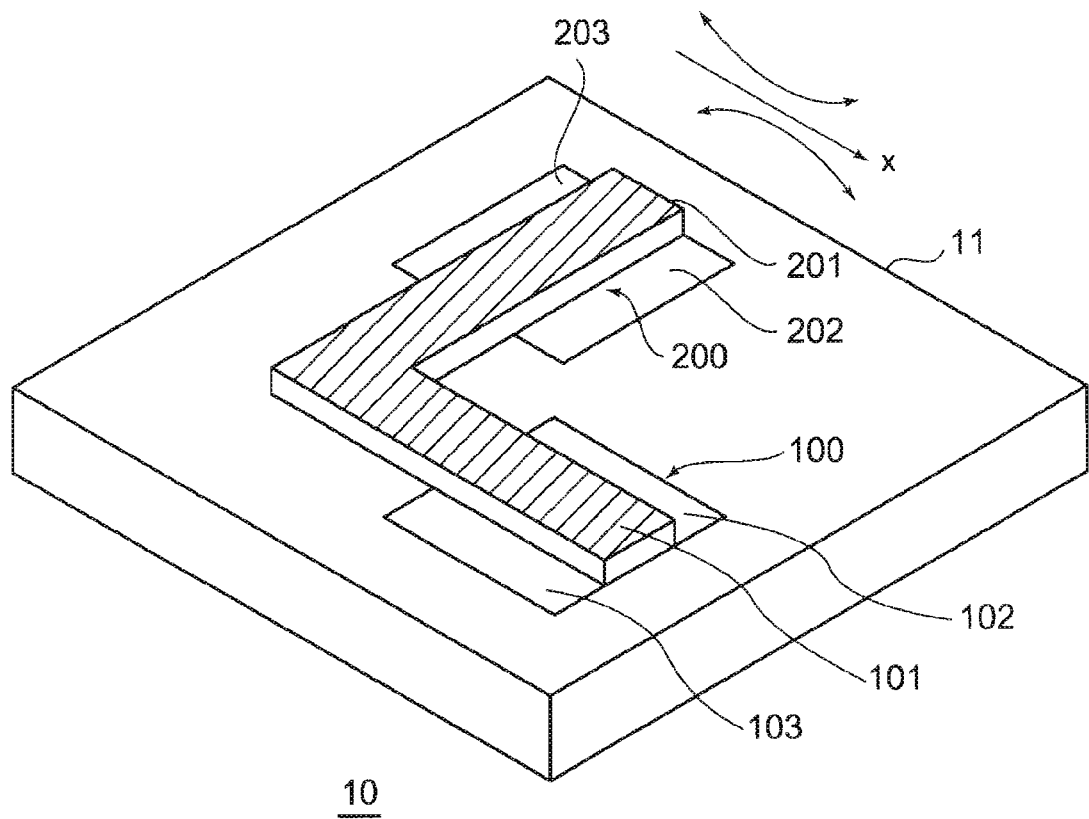
FIG. 9 is a perspective view showing a first example of a transistor having an L-shaped gate.

FIG. 9 shows a third embodiment of the invention. In FIG. 9, the elements corresponding to those in FIG. 1 are indicated by the same reference numerals and not to be explained here.

In the third embodiment, the two transistors 100 and 200 are formed on the substrate 11, wherein the transistors share a single L-shaped gate.

Such a configuration also enables the realization of a semiconductor device that is less susceptible to the influence of substrate curvature.

Embodiment 4

Figure 10:
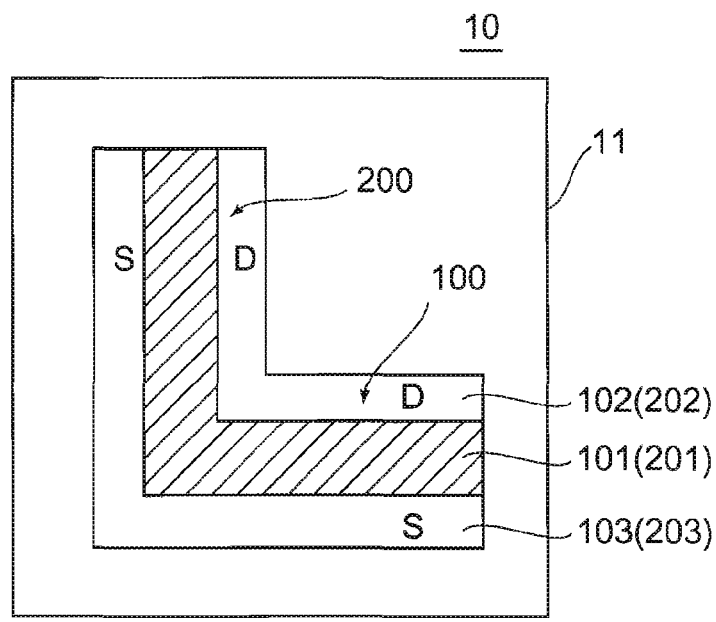
FIG. 10 is a plan view showing a second example of a transistor having an L-shaped gate.

FIG. 10 shows a fourth embodiment of the invention. In FIG. 10, the elements corresponding to those in FIG. 1 are indicated by the same reference numerals and not to be explained here.

In the fourth embodiment, the above-described two transistors 100 and 200 are formed as a single unit on the substrate 11. The two transistors share a single L-shaped gate 101, which is sandwiched by the drain 102 and the source 103.

Such a configuration also enables the realization of a semiconductor device that is less susceptible to the influence of substrate curvature.

Embodiment 5

Figure 11:
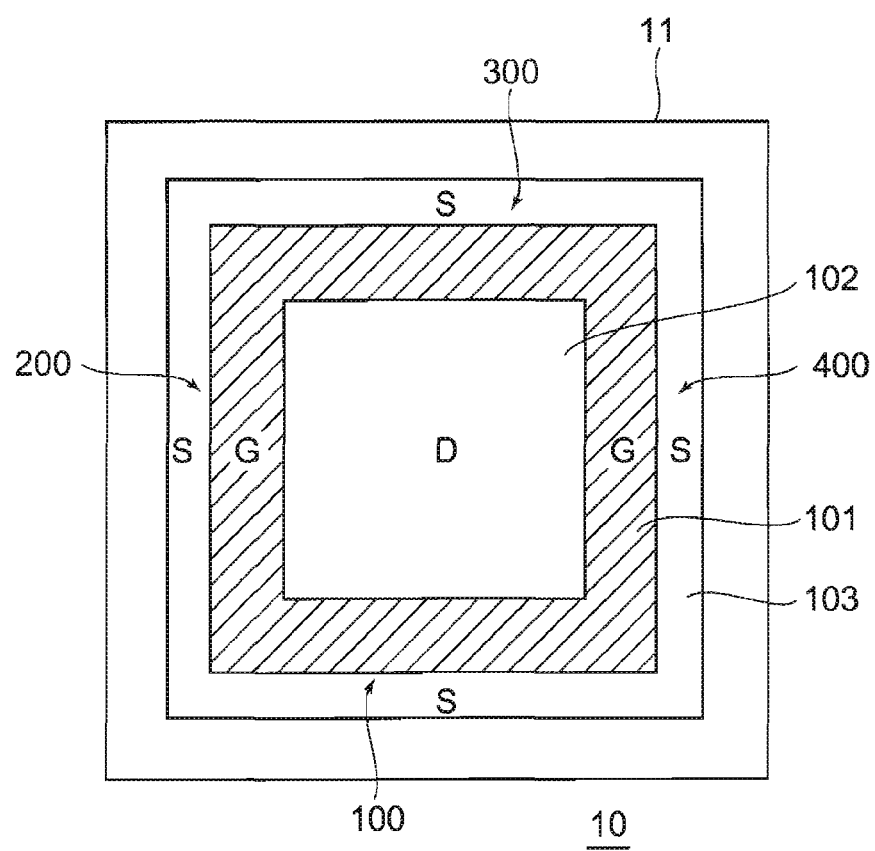
FIG. 11 is an explanatory diagram showing a first example of a transistor having a circular gate.
Figure 12:
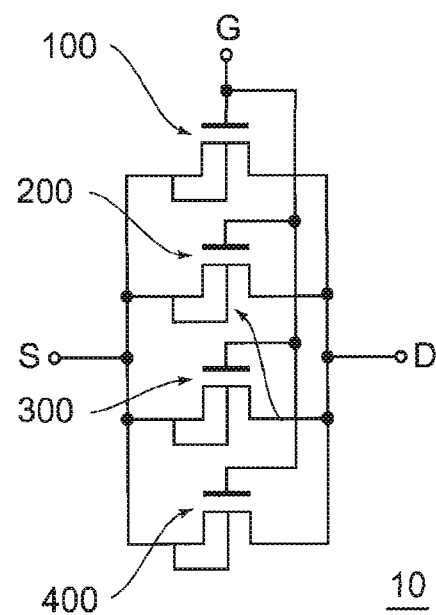
FIG. 12 is an explanatory diagram showing an equivalent circuit of the transistor having a circular gate.

FIGS. 11 and 12 show a fifth embodiment of the invention. In FIGS. 11 and 12, the elements corresponding to those in FIGS. 1 to 10 are indicated by the same reference numerals and not to be explained here.

In the fifth embodiment, the four transistors 100 to 400 are formed as a single unit on the substrate 11. The four transistors share a single rectangular gate 101 with the drain 102 on the inner periphery. Further, the source 103 is formed on the outer periphery of the circular gate 101.

Such a configuration also enables the realization of a semiconductor device that is susceptible to the influence of substrate curvature because the channel widthwise direction of the transistors 100 and 300 coincides with the channel lengthwise direction of the transistors 200 and 400 or the channel lengthwise direction of the transistors 100 and 300 coincides with the channel widthwise direction of the transistors 200 and 400.

As shown in FIG. 12, the transistor employing the circular gate shown in FIG. 11 can be expressed as the semiconductor device 10 wherein the four transistors are commonly coupled (coupled in parallel) to one another at each gate, source, and drain. With the use of four transistors, much larger driving current (drain current) can be obtained.

Embodiment 6

Figure 13:
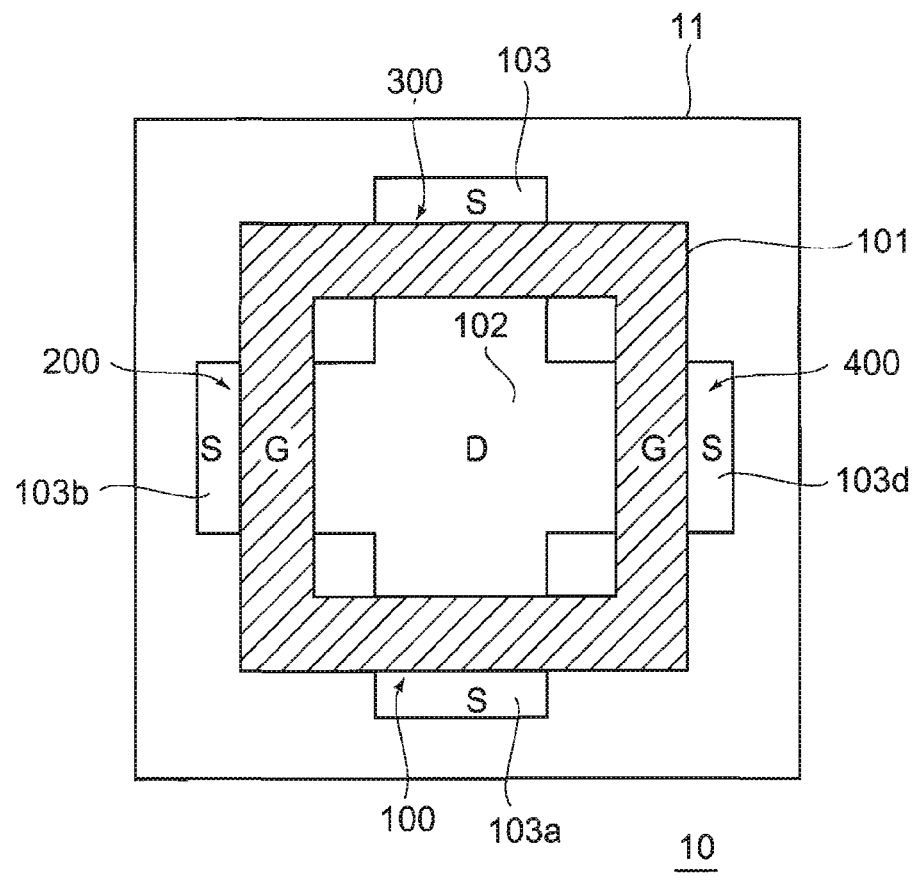
FIG. 13 is an explanatory diagram showing a second example of a transistor having a circular gate.

FIG. 13 shows a sixth embodiment of the invention. In FIG. 13, the elements corresponding to those in FIG. 11 are indicated by the same reference numerals and not to be explained here.

In the sixth embodiment, a semiconductor layer that is patterned in a cross is formed on the substrate 11. Further, the four transistors 100 to 400 are formed as a single unit on the substrate 11. The gates of the four transistors are formed in a ribbon shape on the semiconductor layer so as to serve as a single shared gate 101. The ribbon-shaped gate 101 is configured in a circular form with the drain 102 on the inner periphery. Further, sources 103a to 103d are formed on the outer periphery of the circular gate 101.

What makes the sixth embodiment differs from the fifth embodiment shown in FIG. 11 is that, as in the third embodiment shown in FIG. 9, the corners of the rectangular gate 101 are not used as transistors. Hence, in the case where transistors are formed at the corners of the gate 101, the uncertainty of operation as a transistor (uncertainty of current distribution) at the corners of the gate 101 is avoided.

Such a configuration also enables the realization of a semiconductor device that is less susceptible to the influence of substrate curvature because the channel widthwise direction of the transistors 100 and 300 coincides with the channel lengthwise direction of the transistors 200 and 400 or the channel lengthwise direction of the transistors 100 and 300 coincides with the channel widthwise direction of the transistors 200 and 400.

Embodiment 7

Figure 14:
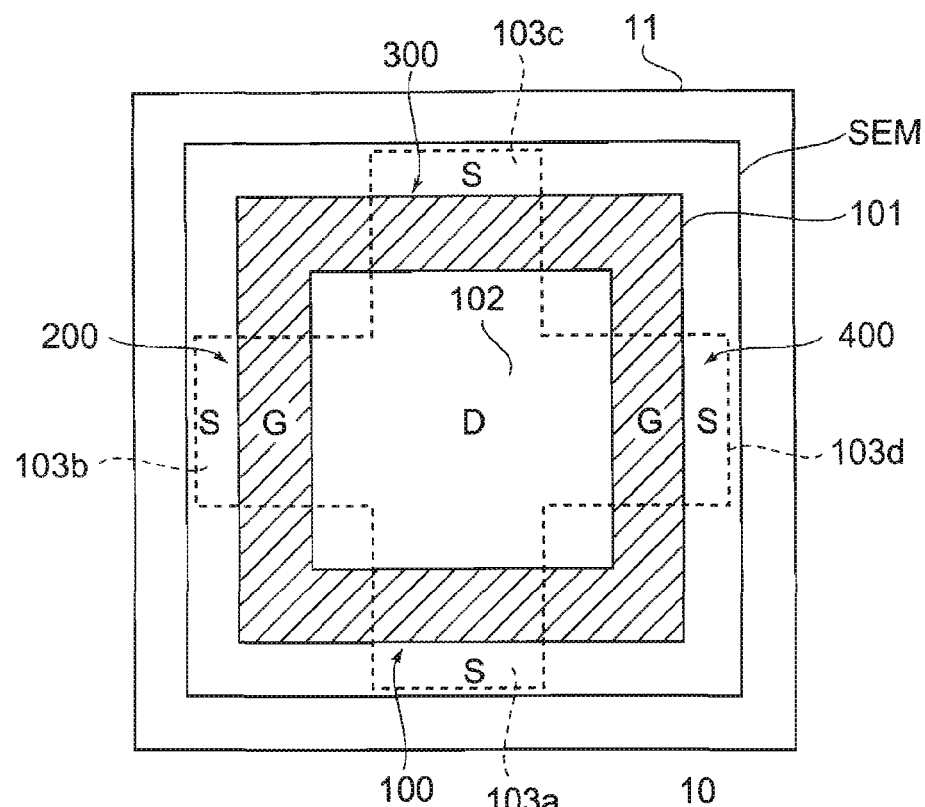
FIG. 14 is an explanatory diagram showing a third example of a transistor having a circular gate.

FIG. 14 shows a seventh embodiment of the invention. In FIG. 14, the elements corresponding to those in FIG. 13 are indicated by the same reference numerals and not to be explained here.

Also in the seventh embodiment, the four transistors 100 to 400 are formed as a single unit on the substrate 11. The four transistors share a single rectangular gate 101 with the drain 102 on the inner periphery. Further, the sources 103a to 103d are formed on the outer periphery of the circular gate 101.

What makes the seventh embodiment differs from the sixth embodiment shown in FIG. 13 is that the drain 102 on the inner periphery of the circular gate 101 and the sources 103a to 103d on the outer periphery of the circular gate 101 are formed by first implanting ions to a region SEM of a rectangular semiconductor layer using a mask, and then forming a highly concentrated impurity region, which is shown as a cross-shaped region indicated by a dotted line in FIG. 14, followed by the activation of the same region.

Therefore, as in the case of the sixth embodiment shown in FIG. 13, no channel regions are formed at the corners of the rectangular gate 101. Hence, the uncertainty of operation as a transistor (uncertainty of current distribution) at the corners of the gate 101 is avoided.

Such a configuration also enables the realization of a semiconductor device that is less susceptible to the influence of substrate curvature because the channel widthwise direction of the transistors 100 and 300 coincides with the channel lengthwise direction of the transistors 200 and 400 or the channel lengthwise direction of the transistors 100 and 300 coincides with the channel widthwise direction of the transistors 200 and 400.

Embodiment 8

Figure 15:
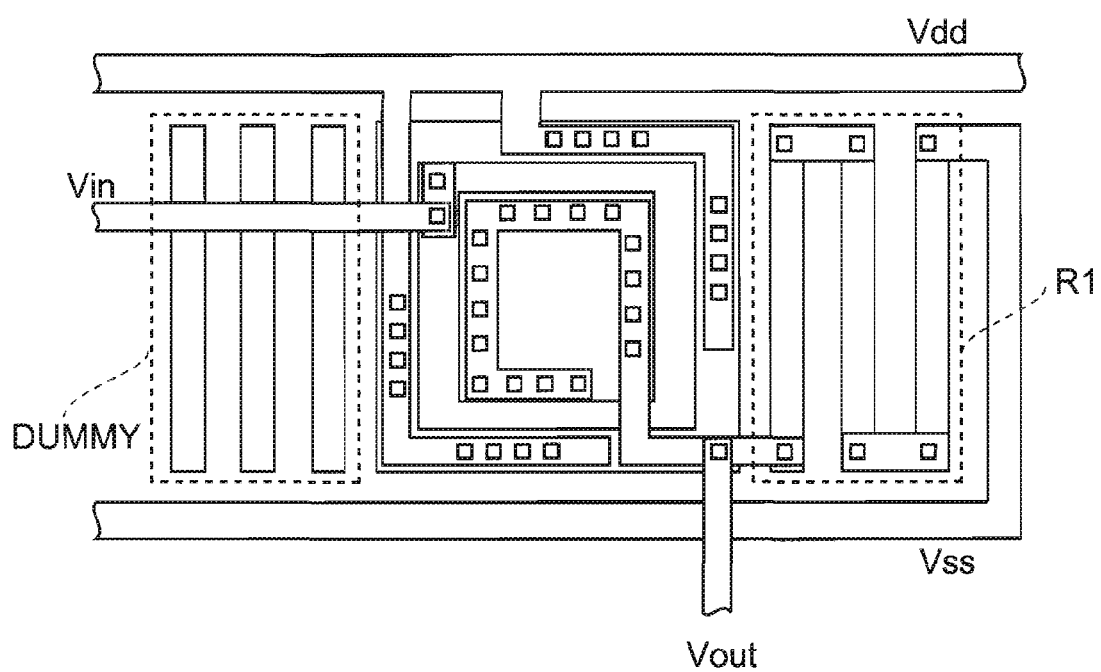
FIG. 15 is an explanatory diagram showing an example circuit pattern of an amplifier using a transistor according to the invention.

FIG. 15 shows an example circuit pattern using a multilayer interconnection film in the case where the amplifier circuit shown in FIG. 6 is configured of a transistor having a circular gate.

As shown in FIG. 15, a transistor according to an eighth embodiment is placed in the center with a dummy resistor, which is not electrically coupled to the other parts, on the left side and a resistor R1 on the right side. Further, a piece of power supply wiring Vdd is laterally provided on the upper side of the transistor and another piece of power supply wiring Vss is laterally provided on the lower side.

The transistor has the above-described circular gate, to which an input signal Vin is applied via a piece of input signal wiring. On the circular source region outside the gate, two pieces of source wiring branching from the power supply wiring Vdd are provided so as to surround the gate from two sides. The source wiring is coupled to the source through a plurality of contact holes.

The drain inside the gate is coupled to a piece of drain wiring through a plurality of contact holes and then to one end of the resistor R1. The resistor R1 is patterned in zigzags with the other end coupled to the power supply wiring Vss. The drain wiring branches off so as to supply a signal output Vout to a next circuit, which is not illustrated.

The eighth embodiment has an advantage that a uniform substrate curvature can be obtained easily because the pattern of the amplifier circuit using the transistor is arranged in approximate symmetry. Hence, the accuracy of curvature compensation in a transistor can be improved easily.

Embodiment 9

Figure 16:
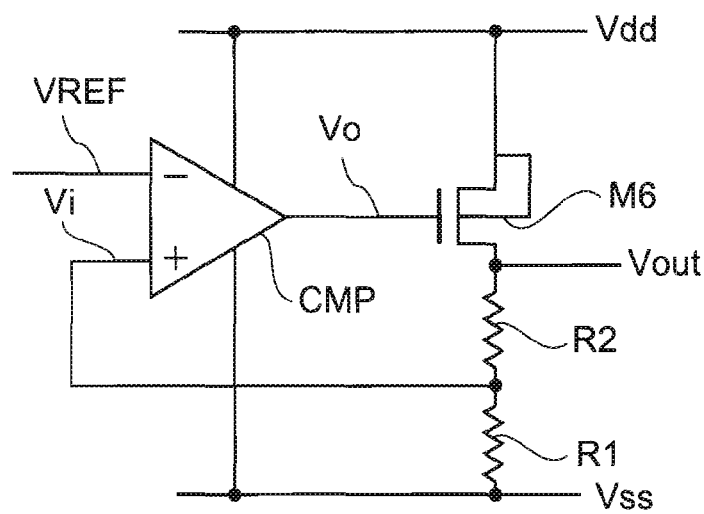
FIG. 16 is a circuit diagram showing an example configuration of a regulator circuit.
Figure 17:
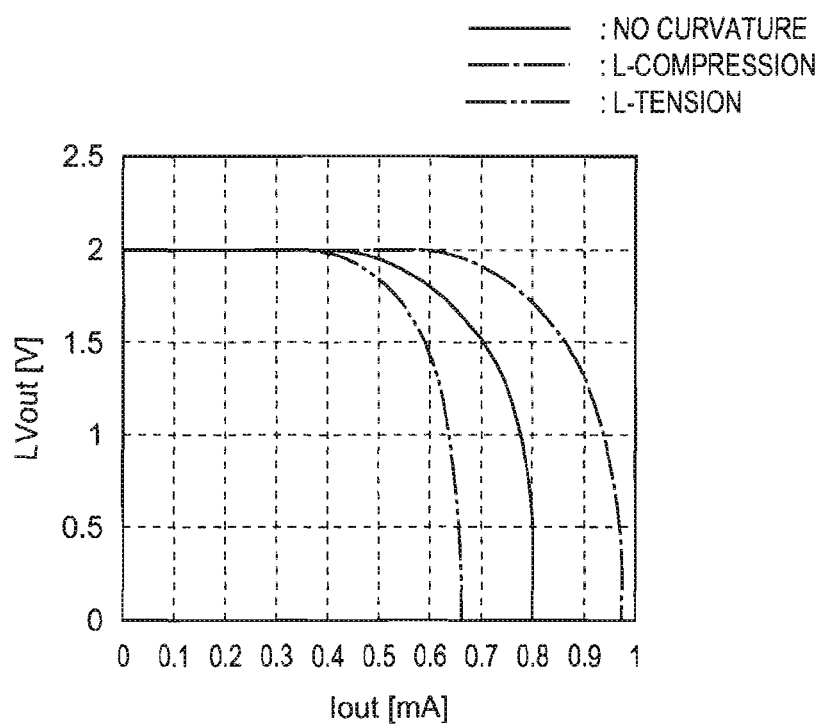
FIG. 17 is a graph showing the change of regulator output voltage with respect to a curvature in the direction of a transistor channel length L.
Figure 18:
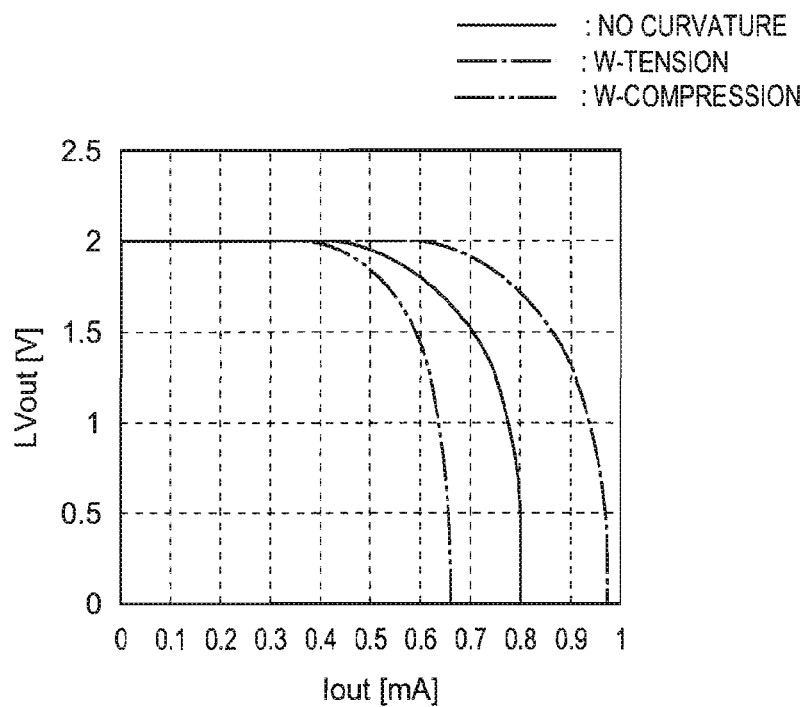
FIG. 18 is a graph showing the change of regulator output voltage with respect to a curvature in the direction of a transistor channel width W.
Figure 19:
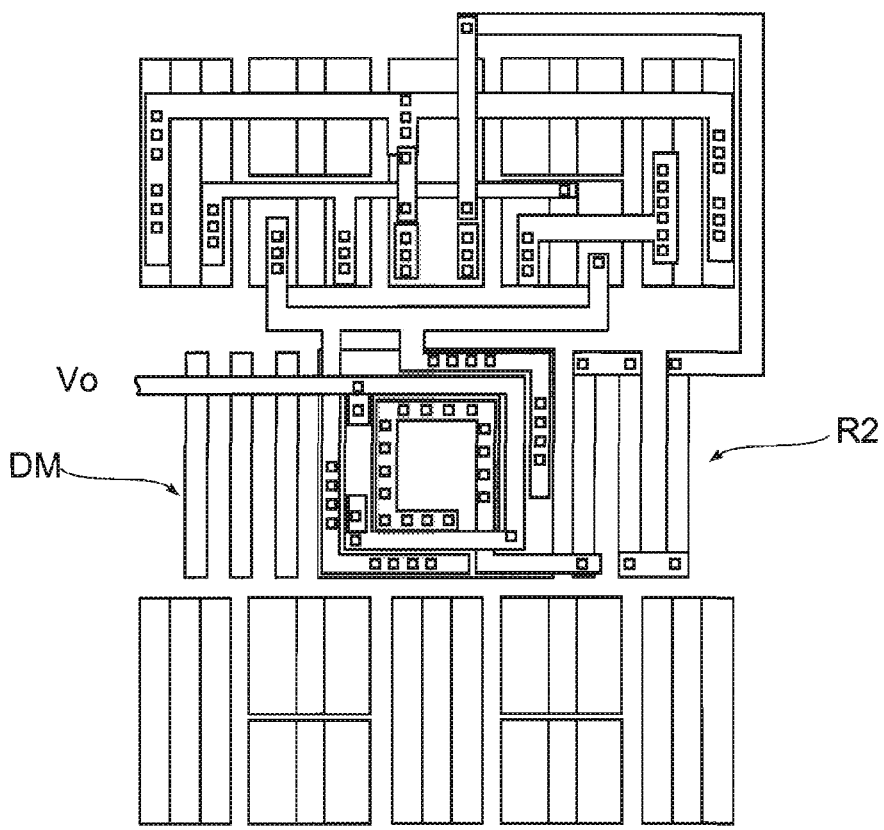
FIG. 19 is an explanatory diagram showing an example of circuit pattern (partial) of a regulator using a transistor according to the invention.

FIGS. 16 to 19 show examples of applying the transistor according to the eighth embodiment to a regulator (constant-voltage) circuit. FIG. 16 is a circuit diagram of the same, FIGS. 17 and 18 are graphs showing the change of output characteristics due to substrate curvature, and FIG. 19 is a circuit pattern diagram showing a circuit pattern around the transistor.

As shown in FIG. 16, the regulator circuit is configured of a level comparator CMP, a PMOS transistor M6, resistors R1 (200 [KΩ]) and R2 (250 [KΩ]) etc. To the source of the transistor M6, an external power supply Vdd of 3.3 [V] is supplied. The voltage is adjusted at the transistor M6, to the gate of which a voltage Vo is applied, and outputted from the drain of the transistor M6 as an output voltage Vout. The output voltage Vout is partially divided by the resistors R2, which is coupled to the drain, and R1 and then returned to the level comparator CMP as a comparator input voltage Vi. As a reference input of the level comparator CMP, a comparator reference voltage Vref (0.89 [V], for example) is applied. The level comparator CMP keeps the output voltage Vout of the transistor M6 at a constant level by, after comparing the reference voltage Vref and the input voltage Vi, supplying the comparator output Vo of a certain level according to the level difference.

When a known transistor wherein no countermeasures for substrate curvature are taken is used in the above-described regulator circuit that is formed on a substrate, the output voltage Vout of the regulator circuit changes due to the curvature of the substrate.

FIG. 17 shows an example of regulator-circuit characteristics in terms of output voltage versus output current in the case where the substrate is bent in the direction of transistor channel length L. In FIG. 17, the characteristics curve indicated by a solid line shows the case of no substrate curvature, the one indicated by a one-dot dashed line shows the case where the channel of the transistor is compressed in the channel lengthwise direction, and the one indicated by a two-dot dashed line shows the case where the channel of the transistor is tensed in the channel lengthwise direction.

When the channel of the transistor is compressed in the channel lengthwise direction, the output voltage level of the regulator circuit increases (shifts to the right in FIG. 17). When the channel of the transistor is tensed in the channel lengthwise direction, the output voltage level of the regulator circuit decreases (shifts to the left in FIG. 17).

FIG. 18 shows an example of regulator-circuit characteristics in terms of output voltage versus output current in the case where the substrate is bent in the direction of transistor channel width W. In FIG. 18, the characteristics curve indicated by a solid line shows the case of no substrate curvature, the one indicated by a one-dot dashed line shows the case where the channel of the transistor is tensed in the channel widthwise direction, and the one indicated by a two-dot dashed line shows the case where the channel of the transistor is compressed in the channel widthwise direction.

When the channel of the transistor is tensed in the channel widthwise direction, the output voltage level of the regulator circuit increases (shifts to the right in FIG. 18). When the channel of the transistor is compressed in the channel widthwise direction, the output voltage level of the regulator circuit decreases (shifts to the left in FIG. 18).

As described above, the range for the regulator circuit to keep the output voltage at a constant level varies with substrate curvature. However, such a problem can be avoided using the above-described transistor wherein the countermeasure for curvature is taken.

FIG. 19 shows an example circuit pattern (around the transistor) wherein the transistor M6 of the above regulator circuit is configured of a transistor having a circular gate serving as a countermeasure for curvature. The circuit is configured so that a symmetric pattern can be obtained by adding a dummy circuit DM appropriately. Therefore, the degree of substrate curvature (how the substrate is bent) can be made uniform.

Embodiment 10

Figure 20:
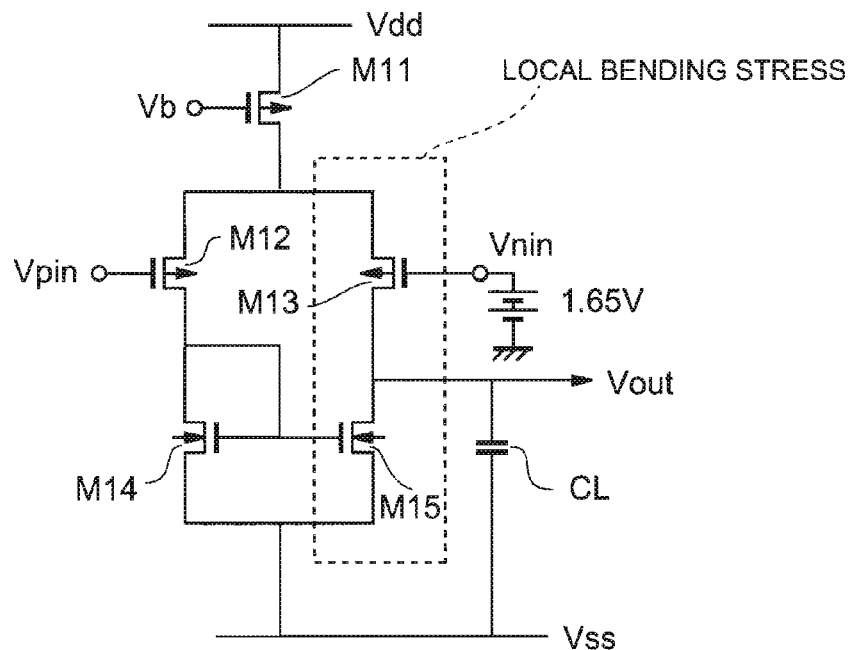
FIG. 20 is a circuit diagram showing an example configuration of a differential amplifier circuit.
Figure 21:
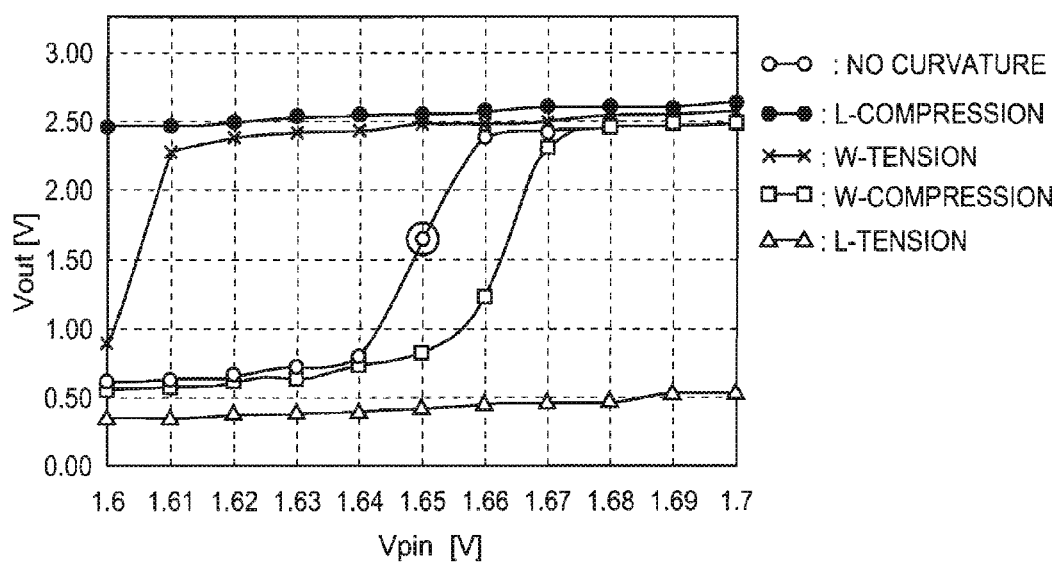
FIG. 21 is a graph showing the change of characteristics caused by bending a substrate having the differential amplifier circuit.
Figure 22:
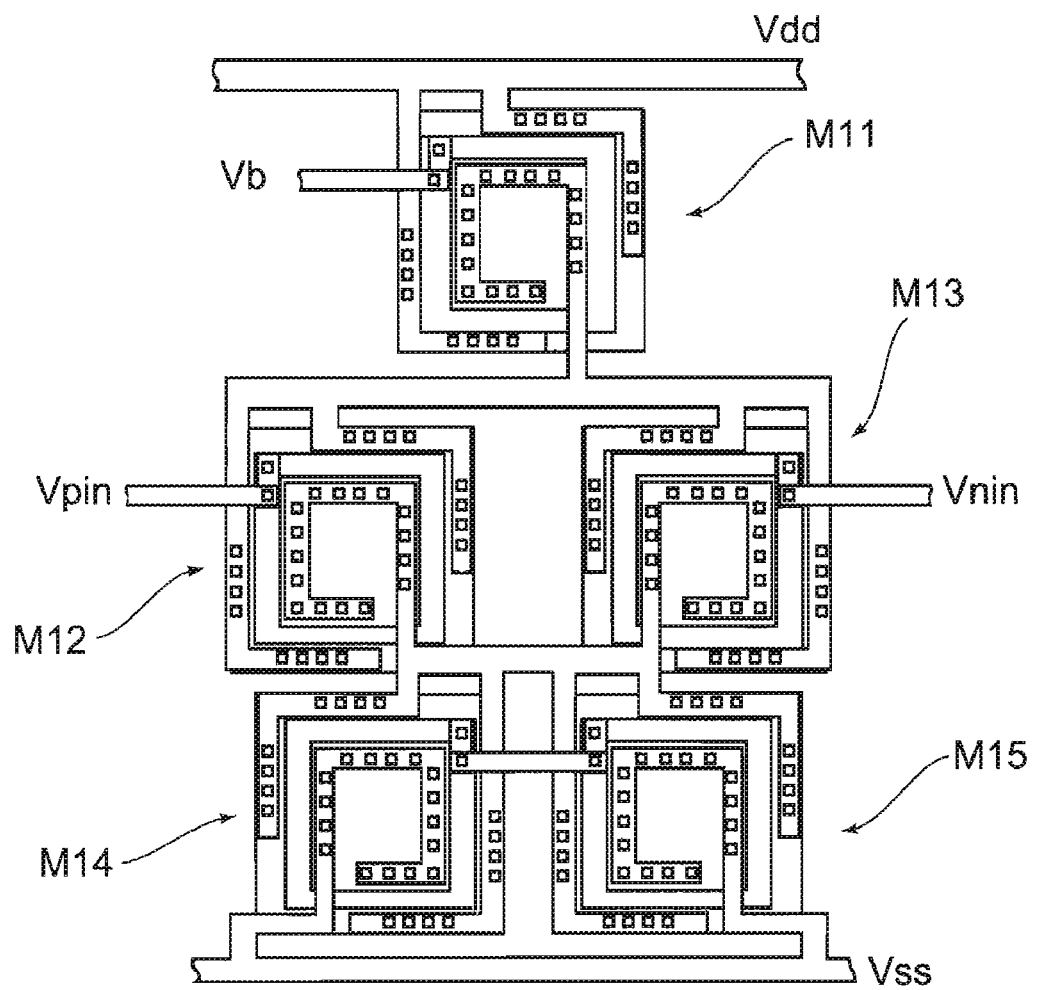
FIG. 22 is an explanatory diagram showing an example circuit pattern of the differential amplifier to which a transistor according to the invention is applied.

FIGS. 20 to 22 show examples of applying the transistor according to the ninth embodiment to a differential amplifier. FIG. 20 is a circuit diagram of the same, FIG. 21 is a graph showing the change of output characteristics due to substrate curvature, and FIG. 22 is a circuit pattern diagram showing a circuit pattern around the transistor.

As shown in FIG. 20, the differential amplifier circuit is configured of a constant current source transistor, a pair of differential transistors, a current mirror circuit etc., all of which are serially coupled to one another between the circuit power supplies Vdd (3.3 [V], for example) and Vss (grounding potential).

The constant current source transistor is configured of a P-type transistor M11. Regarding the P-transistor M11, the source is coupled to the circuit power supply Vdd and the drain is coupled to the common coupling point (source) of the pair of differential transistors. The pair of differential transistors are configured of P-type transistors M12 and M13. Regarding the two transistors, the sources are coupled to each other as a common source and the drains are respectively coupled to a first current path and a second current path of the current mirror circuit. Further, to the gates of the two transistors, the signal inputs Vpin and Vnin are respectively applied.

The current mirror circuit is configured of N-type transistors M14 and M15. The source of the N-transistor M14 is coupled to the drain of the transistor M12, which is the first current path, and the source of the transistor M12 is coupled to the drain of the transistor M13, which is the second current path. The gates of the N-transistors M14 and M15 are coupled to each other as a common gate, which is coupled to the source of the transistor M14. The drains of the N-transistors M14 and M15 are coupled to each other as a common drain, which is coupled to the circuit power supply Vss. In such a configuration, the drain of the transistor M13 is coupled to a circuit output terminal, which is grounded via a capacitor CL (5 [pF], for example).

In the above configuration, when the voltage Vpin is applied to the differential input terminal on the M12-transistor side with the circuit power supply Vdd set to 3.3 [V], the circuit power supply Vss grounded, the gate voltage Vb of the transistor M11 set to 2.2 [V], and the differential input terminal on the M13-transistor side set to a constant voltage of 1.65 [V], the differential output characteristics indicated by the plot of white dots in FIG. 21 can be obtained. However, transistor characteristics change when the substrate is bent, and therefore the output characteristics of the differential amplifier circuit also change.

FIG. 21 shows an example of the change of output voltage characteristics when a bending stress (curvature) is applied locally to the region indicated by a dotted line in FIG. 20.

As shown in FIG. 21, when the transistor is compressed in the direction of its channel width W by bending the substrate, the characteristics curve shifts to the right as indicated by the plot of white squares. When the transistor is compressed in the direction of its channel length L, the output is saturated as indicated by the plot of black dots and the circuit loses its function as a differential amplifier. When the transistor is tensed in the direction of its channel width W, the output level shifts to the left as indicated by the plot of crosses and the circuit loses its function as a differential amplifier. When the transistor is tensed in the direction of its channel length L, the circuit is put into a low-power state as indicated by the plot of triangles and loses its function as a differential amplifier.

The transistor according to the tenth embodiment is preferable because the influence of substrate curvature can be eliminated by using the transistor as a countermeasure for such a problem.

FIG. 22 is a circuit pattern showing an example of applying the transistor according to the ninth embodiment of the invention to the transistors M11 to M15 of the above-described differential amplifier circuit.

By configuring a circuit in a symmetric pattern as shown in FIG. 22, a uniform substrate curvature can be obtained. Further, as described above, by placing a dummy pattern appropriately on the substrate, pattern symmetry and pattern occupancy per unit area can be made equal for each surface and therefore the degree of substrate curvature can be made uniform. Hence, the accuracy of the countermeasure for curvature using the transistor according to the tenth embodiment of the invention can be improved.

Embodiment 11

Figure 23A:
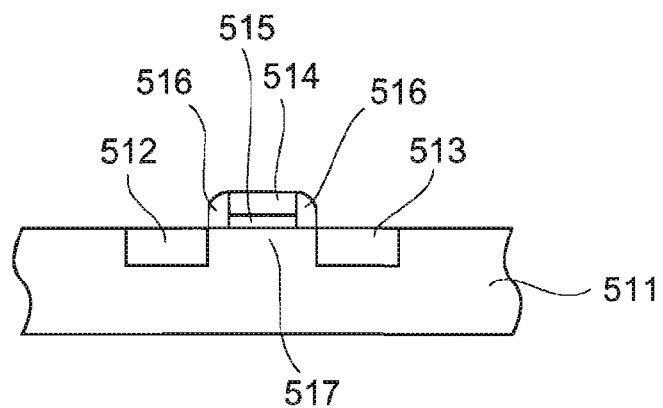
FIGS. 23A to 23C are explanatory diagrams showing a plurality of substrate examples.
Figure 23B:
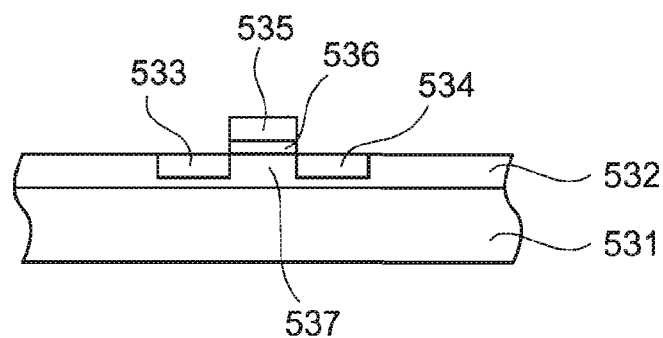
Figure 23C:
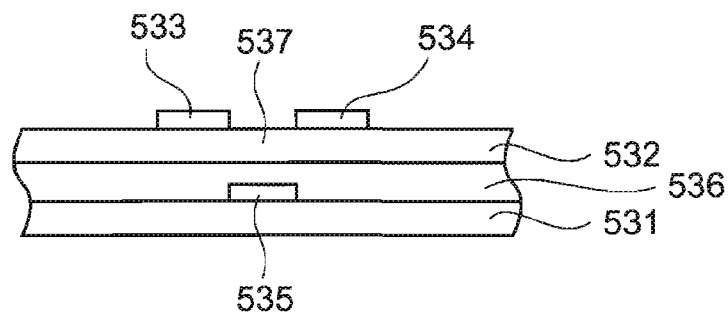

As shown in FIGS. 23A to 23C, the above embodiments of the invention can be applied to transistors of various types.

FIG. 23A shows an example of using a bulk, wherein a source 512, a drain 513, a gate 514, a gate insulation film 515, sidewall spacers 516, a channel 517 etc. are formed on a semiconductor substrate (silicon substrate) 511. By performing chemical mechanical polishing (CMP) from the back surface of such a semiconductor substrate, a flexible thin substrate is obtained.

FIG. 23B shows an example of a top-gate transistor. A semiconductor layer 532, a source 533, a drain 534, a gate 535, a gate insulation film 536, a channel 537 etc. are formed on a flexible insulating substrate 531 such as plastic, for example.

FIG. 23C shows an example of a bottom-gate transistor. The gate 535, the gate insulation film 536, the semiconductor layer 532, the source 533, the drain 534, the channel 537 etc. are formed on the flexible insulating substrate 531 such as plastic, for example.

In addition, examples of the material of the semiconductor layer that configures the above transistors are not limited to inorganic materials such as silicon but includes organic materials. Organic semiconductor materials include, for example, low-molecular organic semiconductor materials such as naphthalene, anthracene, tetracene, pentacene, hexacene, phthalocyanine, perylene, hydrazone, triphenylmethane, diphenylmethane, stilbene, arylvinyl, pyrazoline, triphenylamine, triarylamine, and phthalocyanine, or the derivatives of the foregoing materials; and polymer organic semiconductor materials such as poly-N-vinylcarbazole, polyvinylpyrene, polyvinylanthracene, polythiophene, polyhexylthiophene, poly(p-phenylenevinylene), polyethynylenevinylene, polyarylamine, pyreneformaldehyde resin, ethylcarbazole formaldehyde resin, fluorene-bithiophene copolymer, and fluorene-arylamine copolymer, or the derivatives of the foregoing materials. Further, the use of only one or a combination of two or more of the above materials is also allowable. Alternatively, oligomer including thiophene, triphenylamine, naphthalene, perylene, fluorene etc. can be used.

As described above, with the use of the transistors according to the above embodiments of the invention, a semiconductor device having a high resistance to curvature can be provided.

Electro-Optic Device and Electric Device

The semiconductor device 10 described above can be mounted in an electro-optic device 1 such as a liquid crystal device, an organic EL device, an electrophoretic device etc. An electric device according to a twelfth embodiment of the invention having the electro-optic device 1 will be described.

Figure 24A:
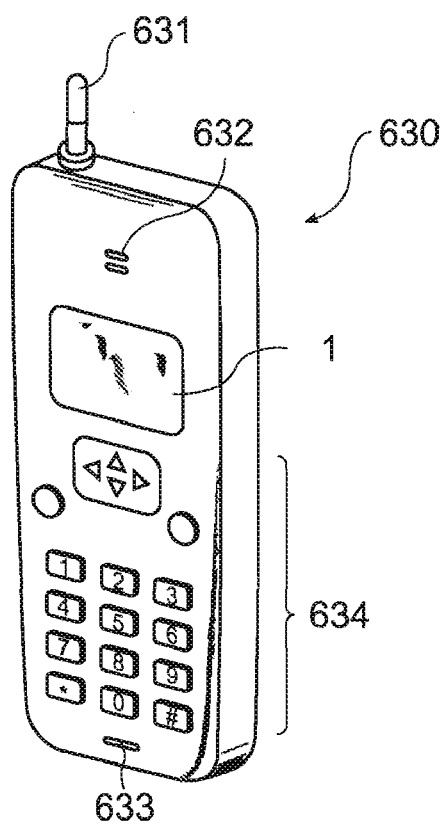
FIGS. 24A and 24B are explanatory diagrams showing applications of a semiconductor device according to the invention to electric devices.

FIGS. 24A, 24B, 25A, and 25B show examples of an electric device to which the electro-optic device 1 can be applied. FIG. 24A shows an example of application to a cellular phone 630, which has an antenna 631, a voice output part 632, a voice input part 633, an operation unit 634, and the electro-optic device 1 according to the twelfth embodiment of the invention. As shown in FIG. 24A, the electro-optic device according to the twelfth embodiment of the invention can be employed as a display, for example.

Figure 24B:
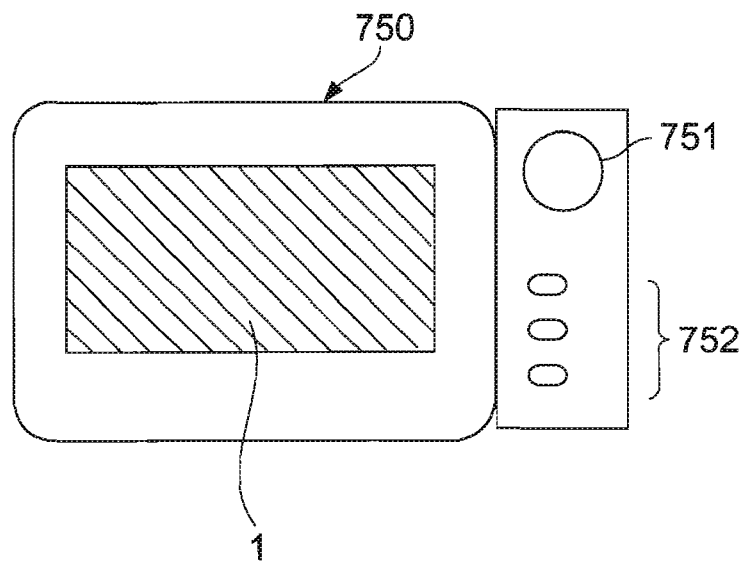

FIG. 24B shows an example of application to a portable electronic book 750, which has a dial operation unit 751, a button operation unit 752, and the electro-optic device 1 according to the twelfth embodiment of the invention.

Figure 25A:
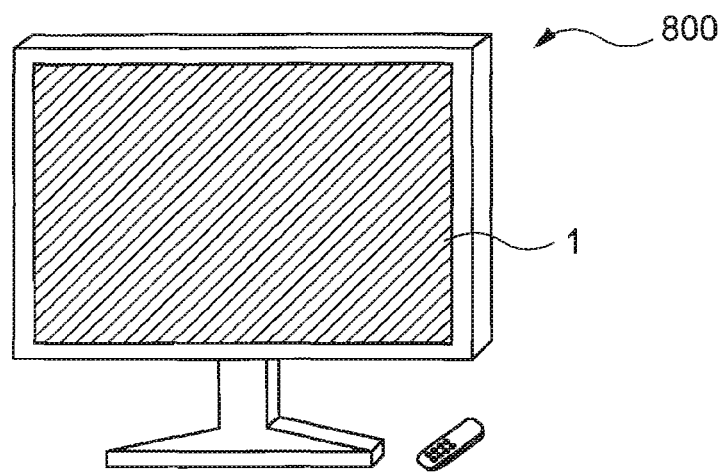
FIGS. 25A and 25B are explanatory diagrams showing applications of a semiconductor device according to the invention to electric devices.

FIG. 25A shows an example of application to an image display device 800, which has the electro-optic device 1 according to the twelfth embodiment of the invention. In addition, the electro-optic device 1 according to the twelfth embodiment of the invention can also be applied to a monitor device used for personal computers etc.

Figure 25B:
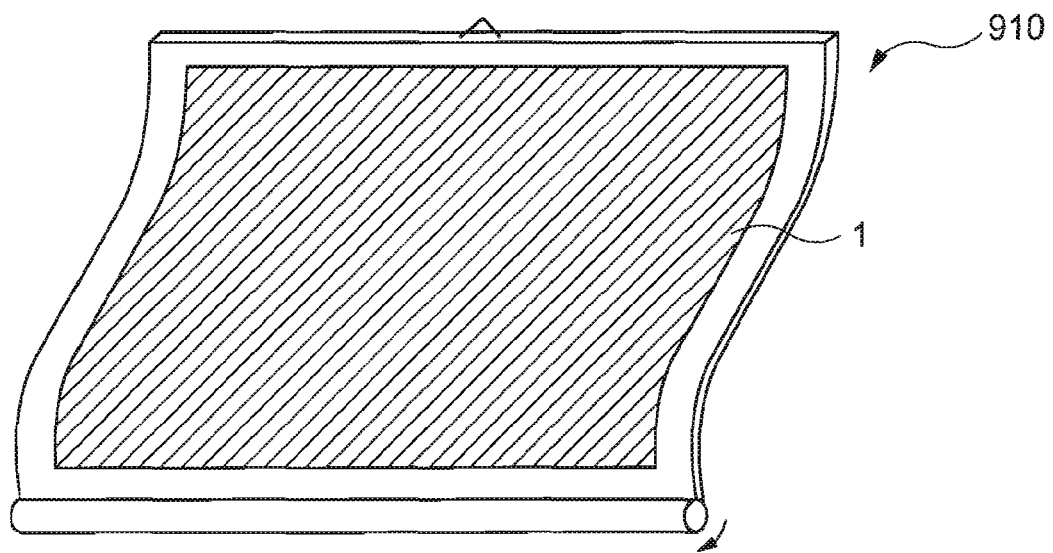

FIG. 25B shows an example of application to a roll-up image display device (television etc.), in particular a roll-up still-image display device 910, which has the electro-optic device 1 according to the twelfth embodiment of the invention.

The invention is not limited to the semiconductor devices, electro-optic devices, and electric devices, which have been described based on the embodiments shown in the accompanying drawings, but can be reconfigured using arbitrary components having the same functions. Further, other arbitrary components can be added to the embodiments of the invention. Furthermore, the invention can include a combination of arbitrary two or more configurations (features) of the above-described embodiments.

What is claimed is:

1. A semiconductor device, comprising:
a semiconductor layer having a source region, a drain region, and a channel region positioned between the source region and drain region, the source region having a first source region and a second source region formed continuously from the first source region, the first source region extending in a first direction and the second source region extending in a second direction, the first direction intersecting the second direction, the drain region including a first drain region and a second drain region formed continuously from the first drain region, the first drain region extending in the first direction and the second drain region extending in the second direction;
a gate electrode overlapping with the channel region, the gate electrode having a first portion and a second portion, the first portion of the gate electrode extending in the first direction, the second portion of the gate electrode extending in the second direction that is intersecting with the first direction; and a gate insulating layer positioned between the semiconductor layer and the gate electrode.

2. The semiconductor device according to claim 1, further comprising:

a flexible substrate on which the semiconductor layer is formed.

3. The semiconductor device according to claim 1, the semiconductor layer being a portion of a semiconductor substrate.

4. The semiconductor device according to claim 1, the channel region having a first region and a second region, the first region of the channel region extending in the first direction, the second region of the channel region extending in the second direction.

5. The semiconductor device according to claim 4, the channel region being formed such that a threshold voltage of the first region of the channel region is different from a threshold voltage of the second region of the channel region when the channel region is bent in the first direction.

6. The semiconductor device according to claim 4, the channel region being formed such that a channel length of the first region of the channel region is larger than a channel length of the second region of the channel region when the channel region is bent in the first direction and that a channel width of the first region of the channel region is smaller than a channel width of the second region of the channel region when the channel region is bent in the first direction.

7. An IC card comprising:

the semiconductor device according to claim 1; and a flexible substrate on which the semiconductor device is formed.

8. The semiconductor device according to claim 1, the gate electrode having a first side and a second side, the source region having a first side formed adjacent to an entire first side of the gate electrode, and the drain region having a first side formed adjacent to an entire second side of the gate electrode.

9. A semiconductor device, comprising:

a semiconductor layer;

a first transistor formed on the semiconductor layer, the first transistor including a first source region, a first drain region and a gate electrode, the gate electrode being positioned between the first source region and the first drain region, a first channel region formed overlapping the gate electrode, the first channel region having a first width and a first length; and a second transistor formed on the semiconductor layer, the second transistor including a second source region and a second drain region and the gate electrode, the gate electrode being positioned between the second source region and the second drain region, a second channel region formed overlapping the gate electrode, the second source region being formed continuously from the first source region, the second drain region being formed continuously from the first drain region, the second channel region having a second width and a second length, a direction of the first length of the first channel coinciding with a direction of the second width of the second channel, a direction of the first width coinciding with a direction of the second length of the second channel.

10. The semiconductor device according to claim 8, the gate electrode having an L-shape.

11. The semiconductor device according to claim 8, a threshold voltage of the first channel region being different from a threshold voltage of the second region when the semiconductor layer is bent.

12. The semiconductor device according to claim 8, the gate electrode having a first side and a second side, the first source region and the second source region having a first side formed adjacent to an entire first side of the gate electrode, and the first drain region and second drain region having a first side formed adjacent to an entire second side of the gate electrode.

* * * * *